(12) United States Patent
Vanden Brande et al.

(10) Patent No.: US 7,156,960 B2
(45) Date of Patent: Jan. 2, 2007

(54) METHOD AND DEVICE FOR CONTINUOUS COLD PLASMA DEPOSITION OF METAL COATINGS

(75) Inventors: Pierre Vanden Brande, Overijse (BE); Alain Weymeersch, Wavre (BE)

(73) Assignee: Cold Plasma Applications, CPA, SPRL, Limal (BE)

( * ) Notice: Subject to any disclaimer, the term of this patent is extended or adjusted under 35 U.S.C. 154(b) by 0 days.

(21) Appl. No.: 10/362,585

(22) PCT Filed: Aug. 23, 2001

(86) PCT No.: PCT/BE01/00142

§ 371 (c)(1),
(2), (4) Date: Aug. 18, 2003

(87) PCT Pub. No.: WO02/16664

PCT Pub. Date: Feb. 28, 2002

(65) Prior Publication Data

US 2004/0026234 A1 Feb. 12, 2004

(30) Foreign Application Priority Data

Aug. 23, 2000 (EP) ................... 00202942

(51) Int. Cl.
*C23C 14/35* (2006.01)
*C23C 16/00* (2006.01)

(52) U.S. Cl. ............................ 204/192.12; 204/192.15; 204/192.17; 204/298.06; 204/298.08; 204/298.09; 204/298.12; 204/298.19; 204/298.24; 427/523; 427/531; 427/571; 427/576; 427/587; 427/593; 118/718; 118/719; 118/723 VE; 118/726

(58) Field of Classification Search ............ 204/192.12, 204/192.15, 192.17, 298.06, 298.08, 298.09, 204/298.12, 298.19, 298.24; 427/523, 531, 427/571, 576, 587, 593; 118/718, 719, 723 VE, 118/726

See application file for complete search history.

(56) References Cited

U.S. PATENT DOCUMENTS 3,799,862 A * 3/1974 Krutenat ............... 204/298.06

(Continued)

FOREIGN PATENT DOCUMENTS

EP 0685571 A1 12/1995

(Continued)

OTHER PUBLICATIONS

Patent Abstracts of Japan; Weight Monitoring System for Molten Material or Sublimating Material and Its Weight Control System; Matsushita Electronic Ind Co Ltd; JP 03274264, Dec. 5, 1991.

(Continued)

*Primary Examiner*—Rodney G. McDonald
(74) *Attorney, Agent, or Firm*—Browdy and Neimark, PLLC

(57) ABSTRACT

A method for the deposition of a metal layer on a substrate (1) uses a cold plasma inside an enclosure (7) heated to avoid the formation of a metal deposit at its surface. The enclosure has an inlet (21) and an outlet (22) for the substrate with a source of metal vapor between them, made up of an electrode to form a plasma (6) with the substrate or a separate electrically conducting element as a counter-electrode. The deposition metal is introduced in the liquid state in a retention tank (8) and is maintained as a liquid at an essentially constant level during the formation of the metal layer on the substrate. An Independent claim is included for the device used to put this method of coating a substrate into service.

40 Claims, 9 Drawing Sheets

U.S. PATENT DOCUMENTS

| | | | |
|---|---|---|---|
| 4,480,585 A | * | 11/1984 | Gattuso ................... 118/719 |
| 5,178,743 A | * | 1/1993 | Kumar .................. 204/298.21 |
| 5,415,757 A | * | 5/1995 | Szcyrbowski et al. . 204/298.08 |
| 6,432,281 B1 | * | 8/2002 | Vanden Brande et al. ......... 204/192.15 |

FOREIGN PATENT DOCUMENTS

| | | | |
|---|---|---|---|
| EP | 0780486 | * | 6/1997 |
| EP | 0908924 A1 | | 4/1999 |
| JP | 11-189872 | * | 7/1999 |

OTHER PUBLICATIONS

Patent Abstracts of Japan; Device for Controlling Molten Metal Level in Vacuum Evaporator; Nisshin Steel Co Ltd; JP 63199868, Aug. 18, 1988.

* cited by examiner

METHOD AND DEVICE FOR CONTINUOUS COLD PLASMA DEPOSITION OF METAL COATINGS

The invention relates to a method of depositing a metal layer on a substrate, the deposition being made by cold plasma inside a confinement enclosure which is heated to prevent a metal deposit from forming on its surface, this enclosure having an inlet opening and an outlet opening through which the substrate to be coated is introduced and fed out, a metal vapour source constituting an electrode being provided in this enclosure, enabling the plasma to be formed therein.

This process specifically enables substrates to be coated with metal on a continuous basis and at high speed, for example metal strips, wires and beams (hot-rolled steels, cold-rolled steels, stainless steel, aluminium, copper, etc . . . ), and non-metal substrates such as sheets of polymer material or paper or alternatively textile fibres, glass fibres, in particular optical fibres, and carbon fibres.

Document U.S. Pat. No. 3,799,862 and document EP 0 780 486 A1 describe processes enabling very high speeds to be achieved during deposition by bombarding the surface of a molten metal or a molten alloy, contained in a crucible, with ions and activated species generated in a plasma created in a metal vapour. In both cases, the surface of the molten metal constitutes the cathode of the deposition system. In the first of the above two cases, ionisation of the metal vapour is activated by a thermo-ionic emission of electrons due to a filament positioned close to the surface of the metal. In the second instance, the electrons are magnetically confined at the cathode in a configuration of the magnetron type, which enables the metal vapour to be ionised to a high degree. However, no provision is made to render the continuous deposition device compatible with a process for coating substrates of variable widths or of enabling long and narrow products such as wires and fibres to be coated without a significant loss of substance.

One solution for adapting to different widths of strip-shaped substrates has already been proposed in document WO98/26108. This solution consists in displacing the metal surface, which is the plasma source, but keeping it relatively close to the surface of the substrates to be coated in order to limit lateral losses, so that this metal surface exactly covers the width of the substrate surface to be coated. This width adaptation requires precise and complicated control, especially in situations where the surface to be coated is subjected to lateral displacements. Furthermore, such a method becomes totally unsuitable as a means of reducing losses of material when coating wires and fibres with transverse dimensions that are always much smaller than the smallest dimension of the metal surface constituting the source of the metal vapour. Nor does this configuration totally prevent lateral losses which might become critical when very high deposition rates are necessary. Such is the case when coating with zinc and applying tin plating to sheets of steel.

One solution to this problem is to use cold plasma deposition inside a hot confinement enclosure, which is in turn contained in a vacuum chamber, as described in document EP 0 908 924 A1. However, the solution described in this document has a number of disadvantages if it has to be used for continuously applying a coating to substrates at high deposition rates over relatively long periods. In effect, in order to heat the confinement enclosure, the latter is totally electrically polarised, either positively or negatively, either by ion bombardment or by electron bombardment. Apart from the risk of contaminating the substrate due to erosion of the walls of the enclosure, this configuration is susceptible to arcing between the polarised confinement enclosure and the cathode, the source of metal vapour, and/or the substrate.

One of the main objectives of the present invention is to propose practical solutions to these various disadvantages and problems.

To this end, at least the part of the confinement enclosure close to the metal vapour source is maintained at a floating potential.

Another aspect of the problem relates to providing the deposition system with a continuous supply of liquid metal and regulating this supply. At a very high deposition rate, the consumption of liquid metal needed for high line speeds can become very high. In order to obtain the right deposition conditions during stationary operation, it is particularly important to keep the distance between the substrate to be coated and the surface of the molten metal constant. Consequently, it is necessary to provide a continuous supply of metal liquid in the tank in order to compensate for consumption. Since the supply must be operated automatically, it is also necessary to provide a system which is capable of controlling this level precisely and which will not be susceptible to contamination by the metal vapours present in the interior of this confinement enclosure.

In accordance with the invention, the metal needed to form the metal layer on the substrate is introduced in the liquid state into a holding tank communicating with the confinement enclosure and the liquid metal in this tank is kept at a substantially constant level whilst this metal layer is being formed.

In one specific embodiment of the invention, the liquid metal in the holding tank is essentially uniformly heated by plasma, in particular by generating a magnetron discharge in close proximity to this tank and preferably at least partially around it. The liquid metal contained in the holding tank acts as the cathode of the deposition device, either continuously or discontinuously. The anode may be the substrate to be coated, in which case the potential of the anode is usually that of the ground of the installation. The anode may also be a separate electrode installed in the confinement enclosure. In this case, it is heated to a high enough temperature to prevent it from being contaminated by the metal vapour and thus avoid short-circuits. In one particularly practical embodiment, in which the device is operated with alternating current, the anode may be provided intermittently, at the frequency of the power supply, in the form of another holding tank supplied with liquid metal separately from the first and placed in the actual confinement enclosure. The two tanks therefore operate in succession as anode and cathode at the frequency of the power supply. Although it is possible to operate at frequencies of from 1 kHz to 1 MHz, the power supplies operate best at frequencies ranging between 10 kHz and 100 kHz.

In one advantageous embodiment of the invention, the holding tank is weighed in order to determine the level of the liquid metal. The tank is supplied with liquid metal depending on the measured weight in order to regulate this liquid metal level.

In another particularly advantageous embodiment, the holding tank is supplied with liquid metal from a reservoir, in which the level of the liquid metal is kept lower than the level of the liquid metal in the holding tank by regulating the metal level in the reservoir depending on the metal level in the holding tank.

The invention also relates to a device for operating the method as defined above.

This device is characterised by the fact that means are provided for maintaining at least the area around the holding tank at a floating potential and for electrically isolating the liquid metal from the enclosure.

Other details and features of the invention will become clear from the description below, given by way of illustration and not intended to be restrictive in any way, of several embodiments of the invention, with reference to the appended drawings.

The same reference numbers are used in the different drawings to denote the same or similar elements.

Figure 1:
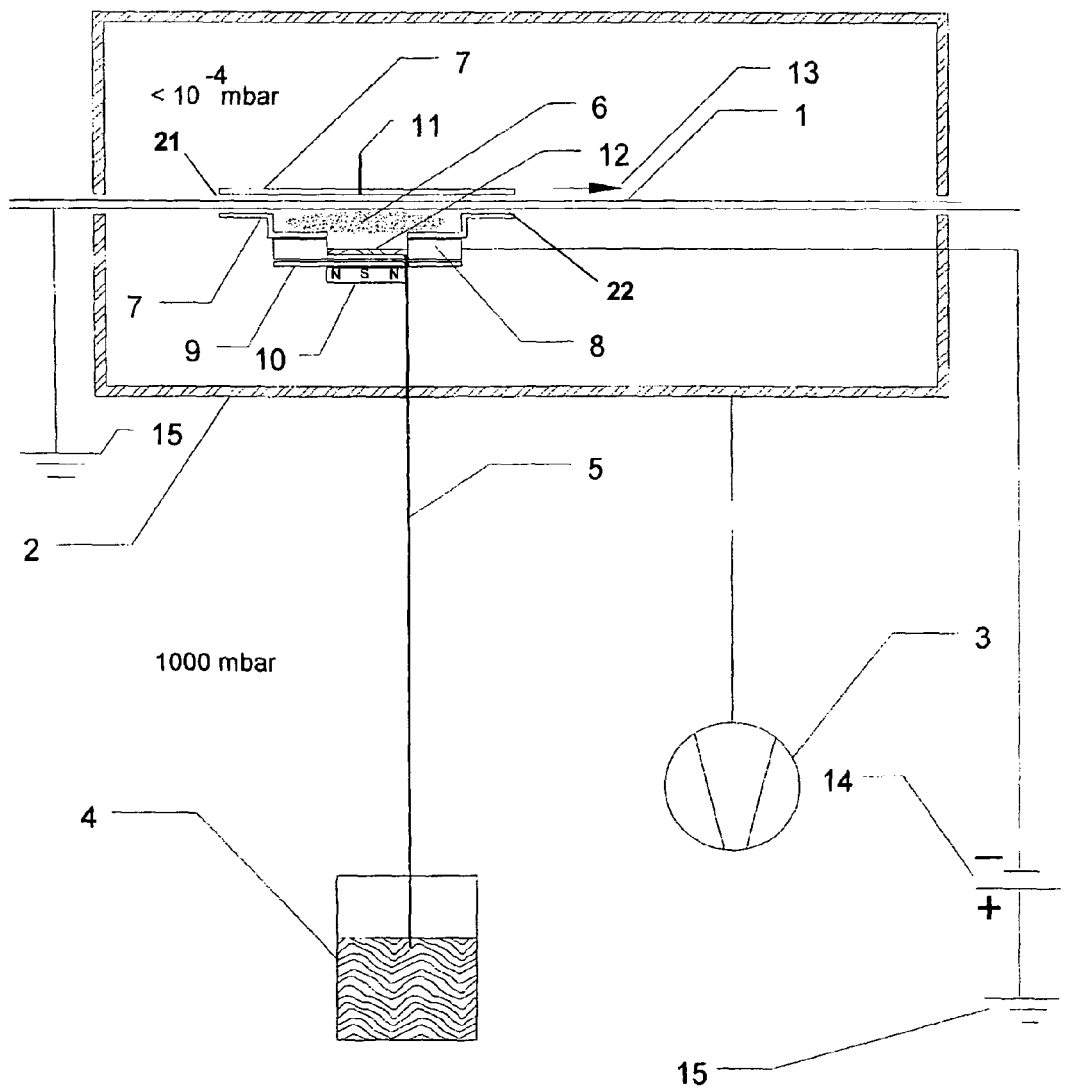
FIG. 1 is a schematic diagram in section, showing a first embodiment of a device proposed by the invention.

The method proposed by the invention consists in creating and confining in a substantially closed space, kept under vacuum, through which the substrate to be coated is fed in a substantially continuous manner, a cold plasma in a metal vapour generated by a molten metal continuously fed into a holding tank in a regulated manner. The free surface of the liquid metal contained in this tank is referred to as the target. The plasma is obtained by negatively polarising the surface of the molten metal with respect to a counter-electrode. This may be done either continuously, in which case the counter-electrode constitutes an anode, preferably formed by the substrate to be coated if it is sufficiently conductive, or alternatively discontinuously with alternating current. In the latter case the counter-electrode may optionally be another target kept in the same confinement enclosure.

If the substrate to be coated is not electrically conductive, the counter-electrode will be a separate electrically conductive element.

This is a specific deposition method assisted by ion bombardment, otherwise known as ion plating, specially devised for continuously coating substrates at high speed as they are fed along. This type of technique is known to lead to the formation of deposits which adhere and provide coverage with more dense coatings than the film coatings which can be applied by a simple evaporation process under vacuum or by cathodic pulverisation or sputtering.

Said metal vapour and the plasma are confined in a confinement enclosure made from a material with a low coefficient of bonding in respect of the vapour generated by whatever metal is used and sufficiently hot to avoid being contaminated by it.

For the purposes of the invention, at least the part of this confinement enclosure adjacent to the holding tank of liquid metal is kept at a floating potential in order to avoid the formation of electric arcs between it and the holding tank.

The confinement enclosure is heated, either directly or indirectly, to a potential close to its operating potential to avoid the formation of arcs.

Direct heating takes place by Joule effect by passing an electric current through the walls of the enclosure. Indirect heating takes place by radiation using at least one electrical heating resistor positioned in the proximity of the walls of the confinement enclosure.

The walls of this confinement enclosure are substantially fixed. Naturally, means are provided, such as slides, central fixing means or folds, to enable the walls to expand yet keep the plasma and metal vapour confined during the changes which occur due to temperature starting from non-operation through to operating conditions.

The substrate enters and leaves this confinement enclosure through inlet and outlet slits or inlet and outlet holes of a shape adapted to suit the cross-sectional shapes of the substrates to be coated. These inlet and outlet openings are provided with hot lips for the purposes of the invention, in order to reduce conductance to the gas passage.

Sealing between the holding tank for the liquid metal and the walls of the confinement enclosure is provided with the same principle in mind.

Substrates of different formats, i.e. of variable widths and thicknesses, are uniformly coated in spite of any lateral displacements which might occur. The dimension of the holding tank for liquid metal in the direction disposed transversely to the substrate is at least equal to the value of the maximum width of a substrate to be treated, which will be in the form of a strip, for example.

Liquid metal is supplied continuously from a holding oven, external to the vacuum chamber, via a tube enabling the difference in pressure between the gas inside the holding oven for the liquid metal and the interior of the confinement enclosure disposed in the vacuum chamber to be generated across the height of the column of liquid metal. The specific feature of this liquid metal supply system is that it avoids any mechanical link between the tube and the holding tank for the liquid metal, which enables the level of the latter in the holding tank to be controlled precisely by weighing it.

Two types of means may advantageously be considered as a means of keeping the supply tube mechanically independent from the holding tank to avoid distorting the weight measurement of the liquid metal contained in the holding tank.

A first solution is to supply the tank by means of an elbow tube running above the top edge of the tank, the end of which is submersed in the liquid metal contained in it without actually touching the tank. The metal is able to overcome the difference in height between the top edge of the tank and the level of the metal by a siphon effect.

A second solution is to run the supply tube through the base of the tank, leaving a space free between the external surface of the tube and the surface of the hole pierced through the base of the tank.

Sealing between the tube and the holding tank, between which there is therefore a clearance, is provided by the surface tension of the metal. The maximum hydrostatic height of the liquid metal in the holding tank producing this sealing effect, measured from the base of the tank, is therefore limited. This maximum height decreases as the clearance increases and the temperature of the liquid metal rises. It is typically in the order of a few centimetres and in the case of zinc and tin, for example, is around 3 to 6 cm for a clearance of less than 1 mm.

Accordingly, with a clearance in the order of 1 mm between the external diameter of the supply tube and the diameter of the hole pierced through the base of the holding tank, giving a maximum height of liquid metal from the base of the tank of up to 4 cm, will typically ensure that the device is sealed up to this maximum height.

The invention also relates to a method and a specific device enabling a magnetron discharge to be created all around the holding tank for the liquid metal passing through the confinement enclosure. The advantage of this configuration is that it enables the surface of the metal and the holding tank to be more uniformly heated. Another advantage is that it enables long and narrow sources of liquid metal to be produced.

In view of the above, the invention uses a number of special features to achieve the intended aim, i.e.:

1. The presence of a confinement enclosure that is very efficient in producing metal vapour and plasma. It is preferable to prevent the vacuum chamber and hence the vacuum pumps from becoming contaminated by a metal deposit. The metal must be deposited on a substrate continuously fed through this enclosure at very high speed within a very short period, which is generally less than one second, and must be so over quite long production periods of seven days, for example. The confinement enclosure is specially designed to avoid contamination by deposits of metal (the material used for the internal walls of the enclosure has a low coefficient of bonding for the metal vapour and there is also the option of heating the walls), ensure that the electrical isolation systems can not be contaminated by deposition, obtain a stable discharge in the metal vapour, i.e. without arcing, but also to minimise losses of metal vapour and energy losses in the deposition system, as will be explained in more detail in the section of the description relating to the various drawings and examples of practical applications.

2. The presence of a system for continuously supplying the device with liquid metal. This system is fitted with a regulating device, which enables the level of liquid metal in the holding tank disposed inside or on a level with the confinement enclosure to be controlled to a very high degree of precision, by weighing. This is very important, firstly as a means of avoiding any overflow and secondly as a means of maintaining the deposition system during stationary operation in spite of inevitable external disruptive influences, such as for example: metal consumption by the deposition system, variations in the level of metal inside the supply oven, the variation in atmospheric pressure, etc.

3. A specific electrical and magnetic configuration enabling the surface of the liquid metal contained in the holding tank to be uniformly heated. This configuration enables a magnetron discharge to be produced in the metal vapour all around the holding tank, which becomes indispensable if long and narrow products such as fibres are to be coated economically at a very high speed. In this configuration, the holding tank must pass through the confinement enclosure, must be built from an electrically conductive material, act as the cathode for the deposition system, either continuously or discontinuously, and must be in the presence of a magnetic induction field inside the confinement enclosure which is oriented in the direction of a series of its generatrices so that this induction field is parallel with its external surface and surrounds it completely.

Apart from these three characteristics, several other specific configurations are proposed as a means of finding the optimum solution to different applications, such as one-sided or two-sided coating and the use of alternating currents to produce the discharge, for example in a reactive process.

The method proposed by the invention is more naturally suited to strips of varying formats in terms of width or thickness, which is indispensable in the steel industry but which also has the advantage of remaining unaffected by slight lateral displacements of the substrate in the confinement enclosure. It enables a deposition of uniform thickness to be obtained, both longitudinally and laterally.

Figure 2:
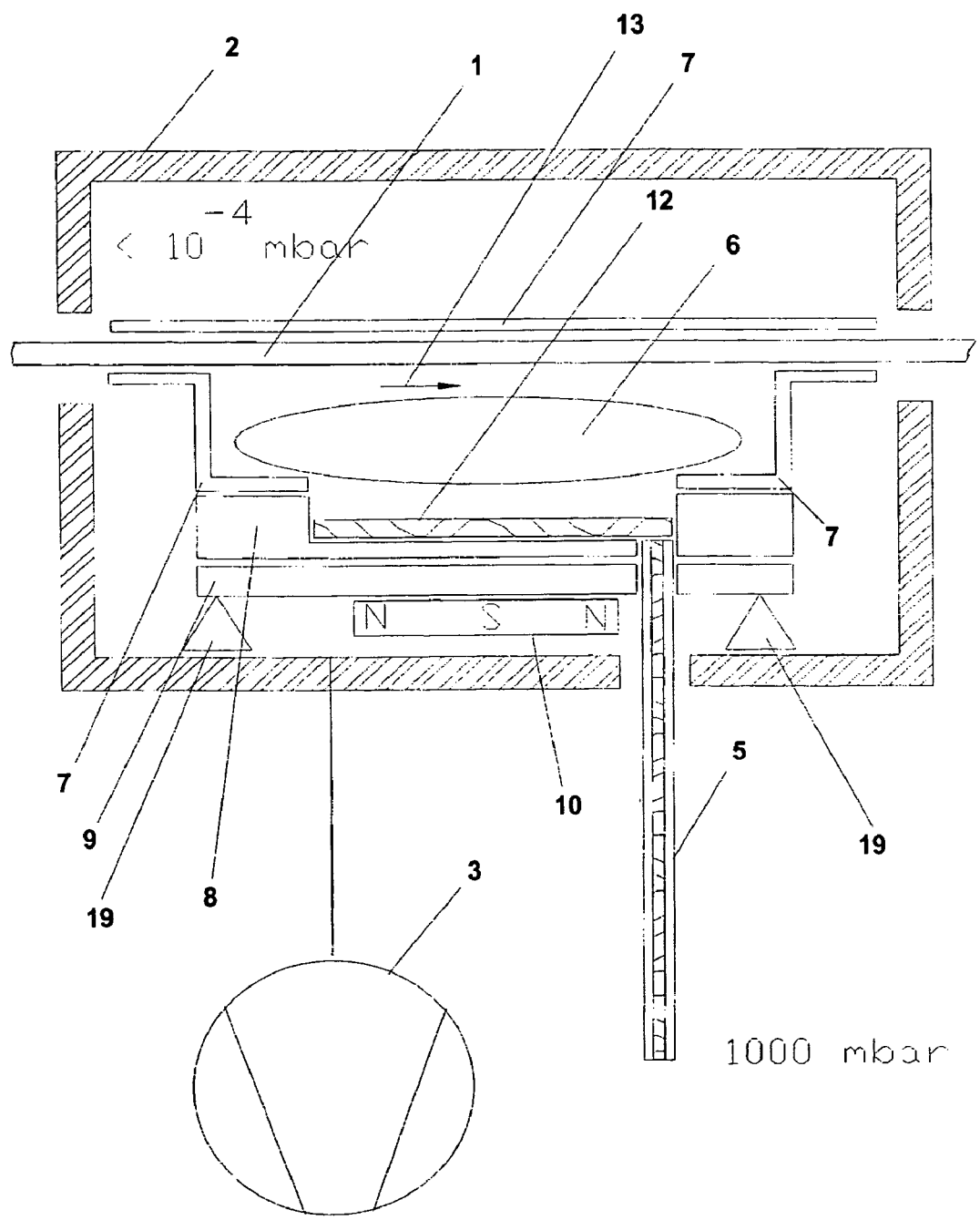
FIG. 2 is a schematic diagram in section, showing the confinement enclosure and holding tank illustrated in FIG. 1 on a larger scale.

FIGS. 1 and 2 illustrate a device proposed by the invention, which is suitable for coating one face of a substrate 1 in the form of a strip, which is fed substantially continuously through a confinement enclosure 7 in the direction indicated by arrow 13.

The confinement enclosure 7, in which a plasma 6 and a metal vapour are created, is at a floating electric potential and is heated to a high enough temperature to prevent a metal coating from forming on its internal surfaces.

The material used to make the internal surfaces of the enclosure 7 is selected so as to reduce the coefficient of bonding of the metal atoms, depending on their nature. In the case of a metal vapour essentially consisting of zinc atoms, a carbon or a hot-oxidised stainless steel is used for the internal surfaces of the enclosure 7.

Located underneath this confinement enclosure 7 is a holding tank 8 for a liquid metal 12. This holding tank 8, and hence the liquid metal, is electrically isolated from the bottom part of the enclosure 7 by leaving a space free between the latter and the holding tank 8.

A supply tube 5 for the liquid metal is provided, which extends through an orifice in the bottom wall of the holding tank 8. The supply tube 5 for the liquid metal in the holding tank 8 is not in contact with the latter. There is in fact a relatively large clearance between the external surface of this tube 5 and the contour of the orifice pierced through tank 8 through which the tube 5 extends. The dimensions of the clearance are such as to provide a seal between the external surface of the tube 5 and the bottom wall of the tank 8 due to the surface tension of the liquid metal, so that the metal is not able to flow through this clearance. This firstly enables the materials to expand to differing degrees and secondly allows the tube 5 to be displaced vertically relative to the holding tank 8.

In order to determine the quantity of liquid metal contained in the holding tank 8 and thus measure the amount of liquid metal consumed as a coating is deposited on the substrate 1, the liquid metal contained in the holding tank 8 is weighed.

To this end, the holding tank 8 sits on supports 19 which serve as a balance. These supports 19 have a piezoelectric strain gauge, for example.

The end of the supply tube 5 opposite that extending through the base of the holding tank 8 opens into a sealed reservoir of liquid metal 4. The level of the liquid metal in this reservoir 4 is lower than the level of the liquid metal in the holding tank 8. This reservoir is disposed in an electric oven, not illustrated, enabling the metal to be melted. The length of the supply tube 5 enables the difference in pressure between the interior of the vacuum chamber 2 and the interior of the reservoir 4 to be compensated by the height of the liquid metal contained in it, measured on the basis of level of metal in the reservoir 4.

The electric power of the oven is used only to melt the metal and to maintain it in the liquid state in the reservoir 4, the atmosphere of which is reducing or neutral in nature, so as to avoid any oxidation of the metal. The pressure of the gas in the reservoir 4, above the liquid metal is either equal to or greater than the value of the external atmospheric pressure. The supply of liquid metal to the holding tank 8 is regulated by the supply tube 5 by modifying the distance between the level of the metal in the reservoir 4 and the level of the metal in the holding tank 8, either by vertically displacing the reservoir or by modifying the value of the gas pressure inside the reservoir 4.

The supply of liquid metal in the holding tank 8 is regulated in this manner depending on the level of the liquid metal therein by varying the height level of the liquid metal contained in the reservoir 4. To this end, regulating means are provided, which enable the reservoir 4 to be displaced in a vertical direction relative to the holding tank 8 and the supply tube 5. Another approach is to vary the higher height level of metal liquid contained in the reservoir 4, not by changing the vertical position of the reservoir 4, but by varying the pressure of neutral gas prevailing there. By neutral gas is meant a gas which does not enter into a chemical reaction with the liquid metal.

As a result of this regulation, the level of the liquid metal in the holding tank 8 can be kept substantially constant during the coating of one or more substrates.

In the specific configuration illustrated in FIGS. 1 and 2, an electric discharge, i.e. a plasma, is generated in the metal vapour between the surface of the liquid metal 12, constituting a cathode, and the substrate 1, forming an anode, connected to ground 15 by means of a continuous current generator 14. In this configuration, the discharge is magnetically confined close to the surface 12 of the liquid metal by the magnetic circuit 10 in order to produce a magnetron discharge. The magnetic circuit 10 is protected from the heat by a heat insulation 9 cooled by circulating water.

The ions and activated species generated in the plasma bombarding the surface 12 of the liquid metal dissipate sufficient energy there to cause it to evaporate, thereby generating a metal vapour. The bottom face of the substrate 1 comes into contact with the vapour and plasma and is thus coated with a metal deposit, unlike its top face which is relatively close to the upper part of the confinement enclosure 7. The substrate 1 is kept at a distance of less than 1 cm from the upper part of the enclosure 7. This proximity significantly limits the amount of metal vapour above to move above the substrate 1.

It can be demonstrated that the pressure of the metal vapour varies in accordance with an exponential law, decreasing as a function of the ratio of the distance to the edge of the product 1 to the distance separating the product from the relevant surface of the confinement enclosure 7.

This same principle is used in the inlet slits 21 and outlet slits 22 to and from the enclosure 7. External losses, i.e. in the vacuum chamber 2 surrounding the confinement enclosure 7, are extremely low because the metal vapour escaping through the slits 21 and 22 is mainly condensed on the cold surfaces of the substrate 1, whereas the metal vapour atoms are reflected by the hot internal surfaces of the inlet 21 and outlet slits 22 of the confinement enclosure 7. If the shape of the slit is in a ratio of 1 to 10, it can be demonstrated that the partial pressure in terms of metal vapour on leaving the slit is 20000 times lower than inside the confinement enclosure 7. By a ratio of 1 to 10 is meant a ratio of 1 to 10 between the height and length of the inlet 21 and outlet slits 22, in the direction in which the substrate 1 is displaced.

Losses of metal vapour through the free space between the hot surfaces of the holding tank 8 and those of the confinement enclosure 7 are also very much restricted due to the fact that the slits are long and narrow. Typically, the system is designed so that the flow through these slits is molecular. This condition will generally prevail in the case of a slit where the distance between walls is a few millimetres. The free distance between the enclosure 7 and the holding tank is therefore generally between 1 and 5 mm and is preferably in the order of 2 to 3 mm. Under these conditions, with a ratio of 1 to 33 between this distance and the length of the slit, it can be demonstrated that the probability of a metal atom being transmitted is 0.11. This probability is then multiplied by the molecular flow to assess the magnitude of metal vapour loss.

The vacuum chamber 2 is connected to a "high vacuum" pumping unit 3, generally consisting of molecular pumps, for example hybrid turbo-molecular pumps, Root pumps and primary pumps.

The general aim is to achieve a base pressure below $10^{-2}$ Pa (or $10^{-4}$ mbar) in the enclosure 7, although the deposition device proposed by the invention is capable of operating in the presence of a relatively high partial pressure of a gas in addition to the metal vapour, such as for example: Ar, He, $N_2$, $O_2$. This being the case, however, the pressure of this additional gas must remain below 1 Pa (or $10^{-2}$ mbar).

Typically, the distance between the surface of the liquid metal 12 and the face of the substrate 1 to be coated must be at least a few cm, and preferably at least 3 cm. As described above, the tank 8 is supplied by means of the tube 5 immersed in the molten metal in a reservoir 4, the higher liquid level of which is regulated either by regulating the pressure of a neutral gas introduced into a sealed reservoir 4 or by raising and lowering the reservoir 4 relative to the end of the tube 5. The neutral gas may be argon, nitrogen and hydrogen or any other neutral gas.

The method proposed by the invention is always initiated by injecting a rare gas such as argon into the confinement enclosure 7 or into the vacuum chamber 2 in order to maintain a pressure of less than 10 Pa in the enclosure 7. This enables the holding tank 8 to be pre-heated by a plasma produced in this rare gas before introducing the liquid metal into the holding tank 8 via the supply tube 5. The rare gas is injected by means of an injector 11 which, in FIG. 1, opens directly into the confinement enclosure 7.

The method is halted by emptying the holding tank 8 via the supply tube 5 and cutting off the power supply 14 to the device.

In order to establish deposition conditions, having introduced the liquid metal via the tube 5 into the holding tank 8, the injection of argon, for example, is gradually reduced until a partial pressure of argon of less than 1 Pa is reached. Generally speaking, the injection of argon is completely halted and the residual pressure in the vacuum chamber 2 is less than 0.1 Pa ($10^{-4}$ mbar), whereas the pressure of the metal vapour inside the confinement enclosure 7 is generally in excess of 0.1 Pa ($10^{-3}$ mbar).

During operation, the mean power densities to be applied at the surface of the target, i.e. the surface 12 of the liquid metal, will naturally depend on the nature of the metal but will be below 200 W/cm$^2$. In general, the mean power density is between 5 W/cm$^2$ and 100 W/cm$^2$ at differences in potential of less than 1500 V between the cathode 12 and the anode 1. The differences in potential between the anode and the cathode are generally between 300 V and 1000 V.

In the configuration illustrated in FIGS. 1 and 2, the electric discharge is preferably achieved by negatively polarising the liquid metal surface 12 with continuous current or pulsed current, for example, simply rectified.

The formation of a metal deposit on the substrate 1 due to the simultaneous condensation of evaporated atoms and metal ions imparts excellent physical properties to the deposit, such as a very good adhesion to the substrate 1 and a non-porous structure with particularly fine grains, which is of advantage when the coated substrate is deformed during use. It is for this reason that this method is particularly well suited to the process of continuously coating a substrate 1 with a deposit of zinc as it is fed along. Not only does this zinc-coating technique produce coatings of excellent quality, it also has an economic advantage over the conventional techniques currently used to coat continuously fed steels in the form of wire or sheet and for dipping beams. These conventional techniques are electro-zincking and dip-galvanizing. Apart from requiring a lower energy consumption to produce an equivalent coating, this new technique does not require the presence of a chemical plant adjoining the coating line for treating effluents by electrolysis. Nor does it require heavy investment in a continuous annealing oven, which is indispensable before dipping sheet in the zinc tank in a dip-galvanizing plant. Clearly, the method proposed by the invention is not restricted to this metal and apart from coating with Zn and its alloys it is also suitable for depositing any metal or metal alloy which can be conveyed in liquid state by the device described above into the confinement enclosure 7 for discharge purposes. Other metals which might be used are tin, magnesium, aluminium and their alloys, for example. Naturally, it will be necessary to make adjustments in terms of temperature and as regards the materials from which the confinement enclosure 7 and the holding tank 8 are made in order to avoid problems due to contamination by the metal vapour and corrosion by the liquid metal depending on the nature of the latter. Adjustments will also have to be made as to the choice of materials used for the tube 5 and the reservoir 4.

Figure 3:
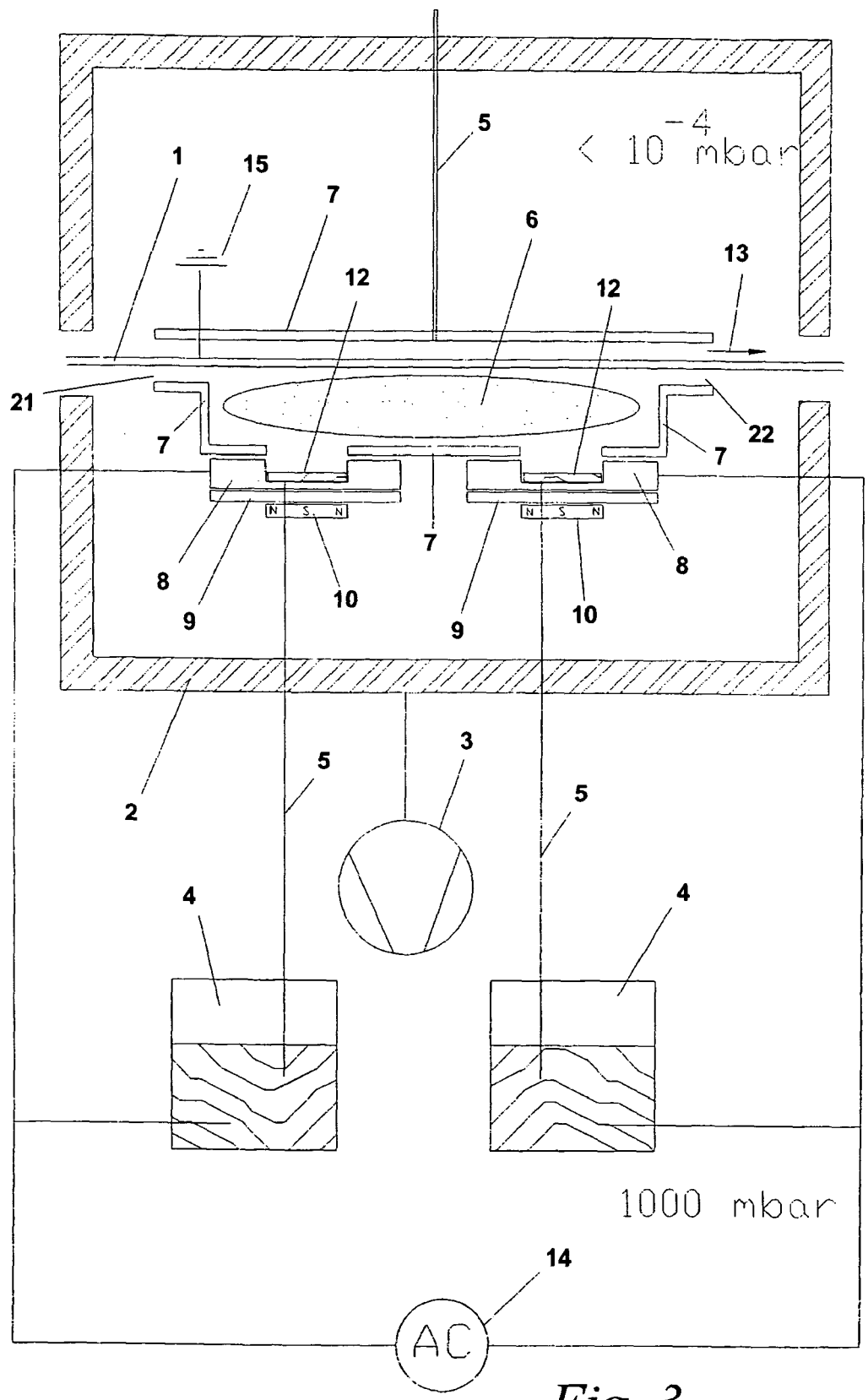
FIG. 3 is a schematic diagram in section, showing a second embodiment of a device proposed by the invention.

FIG. 3 shows a twin arrangement of the configuration described above with reference to FIGS. 1 and 2. This embodiment enables the bottom face of a substrate 1 to be coated, in the form of a strip fed in the direction of arrow 13. Two different holdings tanks 8 and 8' for a liquid metal are provided underneath the confinement enclosure 7. The two tanks 8 and 8' may contain the same metal or two different metals. In this configuration, alternating excitation is used to negatively polarise the two liquid metal surfaces 12 in the holding tanks 8 and 8' alternately. It is very important to ensure that the power supply 14 is totally electrically isolated both from the walls of the confinement enclosure 7, but also from the substrate 1 to be coated in order to be able to create a stable electric discharge, i.e. a plasma, between the two holding tanks 8 and 8'.

The power supply 14 of each tank 8 and 8' operates not only on a level with the reservoirs 4 and 4' but also on a level with the tanks 8 and 8' themselves, in order to pre-heat them before introducing the liquid metal via the supply tubes 5 and 5'. Accordingly, in this configuration, it is clear that the two reservoirs 4 and 4' must be electrically isolated with respect to the potential of the substrate 1, the potential of the walls of the enclosure 7, but also from one another.

The substrate 1 is grounded 15. This embodiment of the device enables substrates 1 that are not electrically conductive to be coated.

Figure 4:
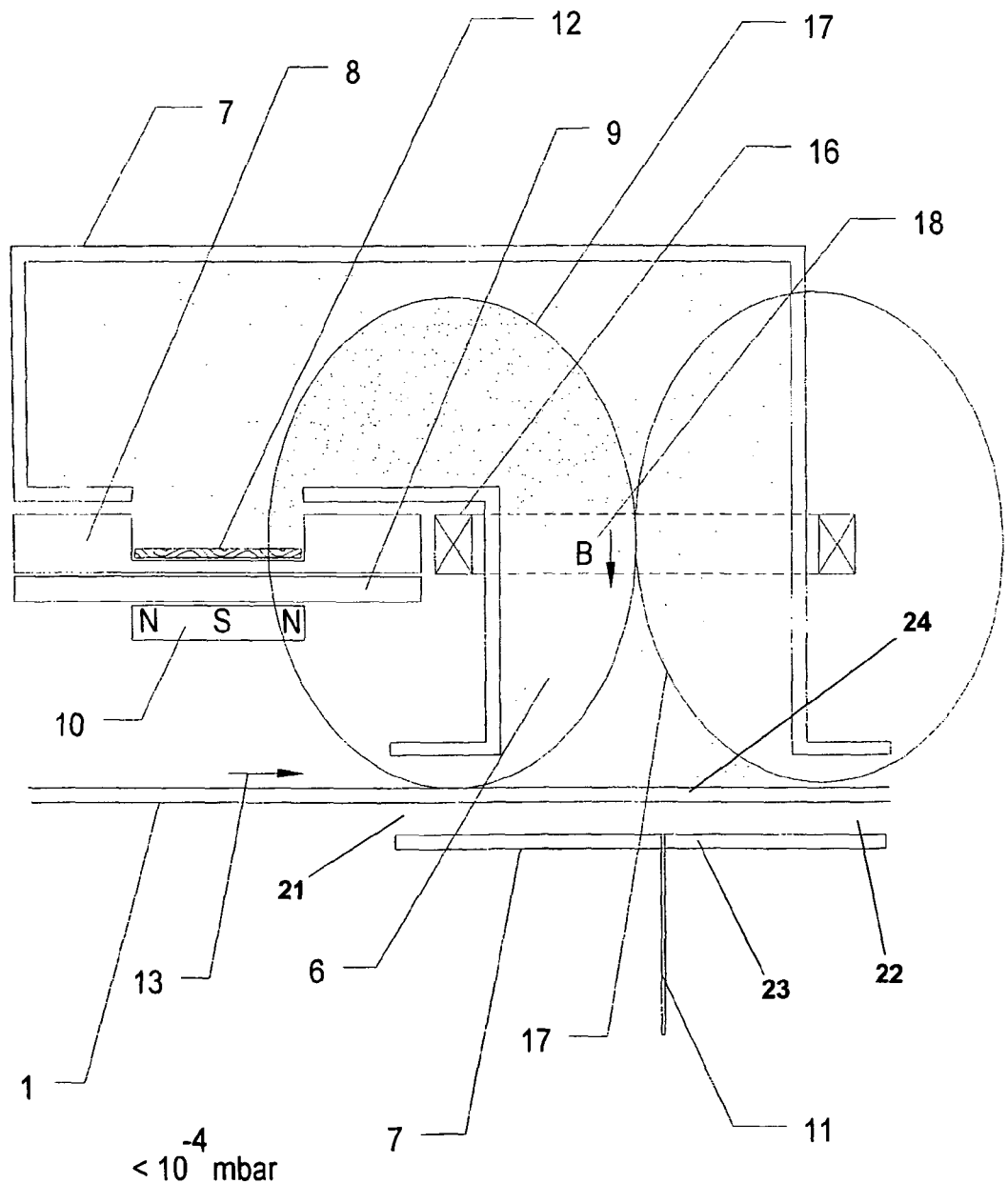
FIG. 4 is a schematic diagram section, showing a third embodiment of the device proposed by the invention.

The configuration illustrated in FIG. 4 is used for coating the top surface of a substrate 1 in the form of a strip continuously fed through a confinement enclosure 7 and having an L-shaped section. Although not illustrated in the drawing, the holding tank 8 is supplied with liquid metal via a tube 5 that is mechanically independent of the tank 8. As in the embodiment described with reference to the previous drawing, the tank is connected to a power generator, not illustrated in FIG. 4.

The level of the metal 12 in the holding tank 8 is also controlled simply by weighing the tank 8. To avoid any deposit on the bottom face of the substrate 1, it is kept close to the bottom wall 23 of the confinement enclosure 7.

The confinement enclosure 7 is supplied with argon gas via in injector 11 when the process is initiated. To enable an electric discharge to be generated in the metal vapour, a constant magnetic induction field 17 is created by means of a solenoid 16, enabling the electrons emitted at the surface 12 of the liquid metal to reach the surface 24 of the substrate 1 to be coated, in which case the latter acts as an anode. The magnetic induction field is typically raised to at least 0.005 T (or 50 Gauss), the direction of the vector 18 of the induction field being irrelevant.

The solenoid 16 surrounds the confinement enclosure 7 and is disposed so that the magnetic field is created substantially transversely to the surface 24 of the substrate 1 to be coated.

The confinement enclosure 7 is maintained at a floating potential, which avoids creating electric arcs between the walls of the enclosure 7 and the holding tank 8 containing the liquid metal on the one hand and between the walls of the enclosure 7 and the substrate 1 acting as the anode of the device on the other. A generator 14, not illustrated, negatively polarises the liquid metal 12 with respect to the electric potential of the substrate 1, either continuously or in an alternating manner by means of a pulsed current. In the latter case, a simply rectified current may be used.

Figure 5:
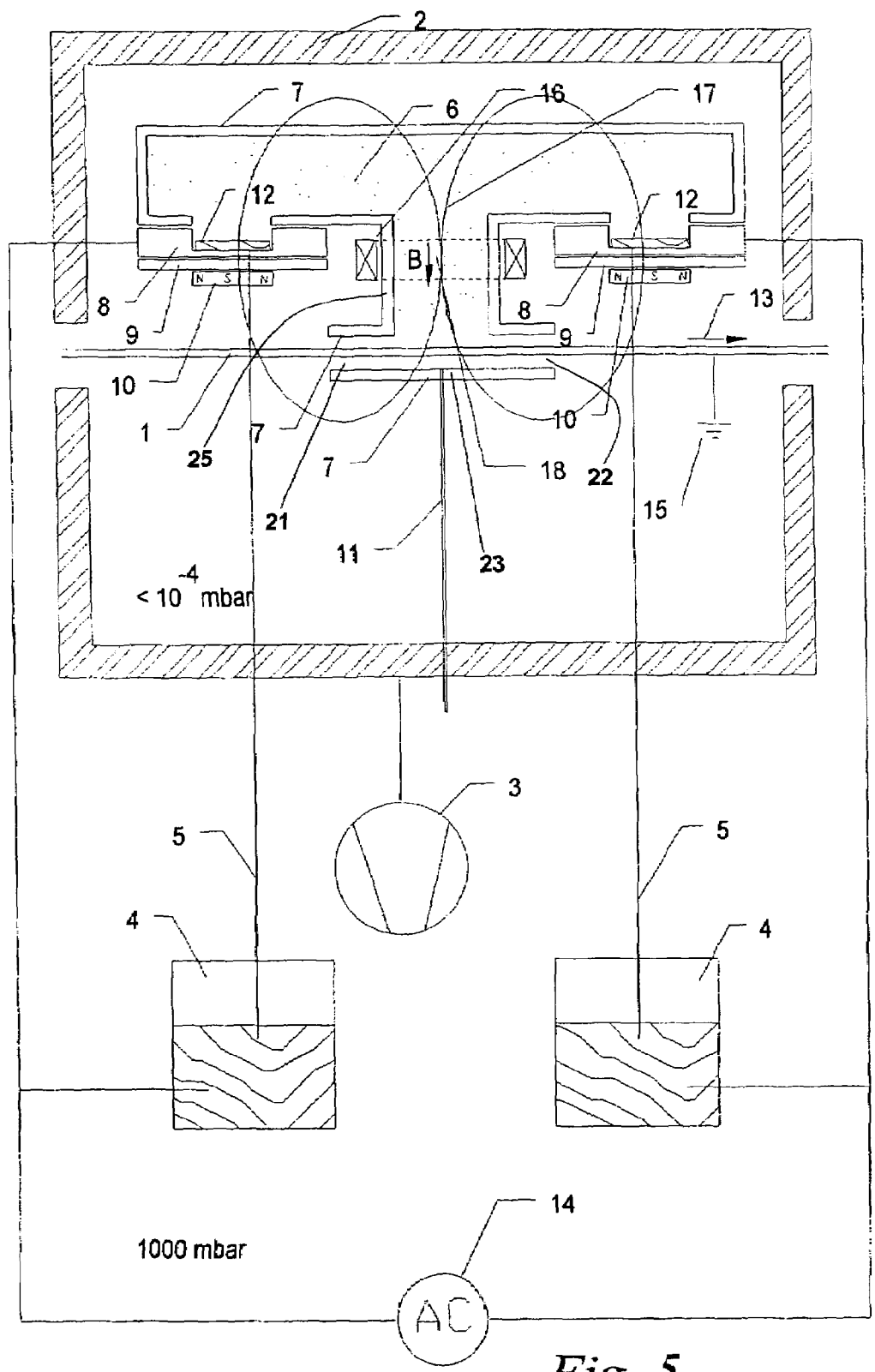
FIG. 5 is a schematic diagram in section, showing a fourth embodiment of a device proposed by the invention.

FIG. 5 illustrates an embodiment of the device proposed by the invention having two holding tanks 8 and 8' containing a liquid metal and having a T-shaped confinement enclosure 7. The enclosure 7 illustrated therefore has a vertical tubular part 25 surrounded by a solenoid 16 between the two holding tanks 8 and 8'. An inlet opening 21 and an outlet opening 22 for a substrate 1 are provided in the bottom part of this tubular part 25 of the confinement enclosure 7.

In this configuration, an alternating excitation is used to negatively polarise the two surfaces 12 of liquid metal in the holding tanks 8 and 8' on an alternating basis. It is very important to provide a power supply 14 which is totally isolated from the walls of the confinement enclosure 7, but also from the substrate 1 to be coated, so that a stable electric discharge, i.e. a plasma, can be generated between the two holding tanks 8 and 8'. The power supply of each holding tank is operated not only on a level with the reservoirs 4 and 4' but also on a level with the tanks 8 and 8' themselves in order to pre-heat them prior to introducing the liquid metal via the tubes 5 and 5'. It is therefore clear that in this configuration, the two reservoirs 4 and 4' must be electrically isolated from the potential of the substrate and the potential of the walls of the confinement enclosure 7, but also from one another.

Figure 6:
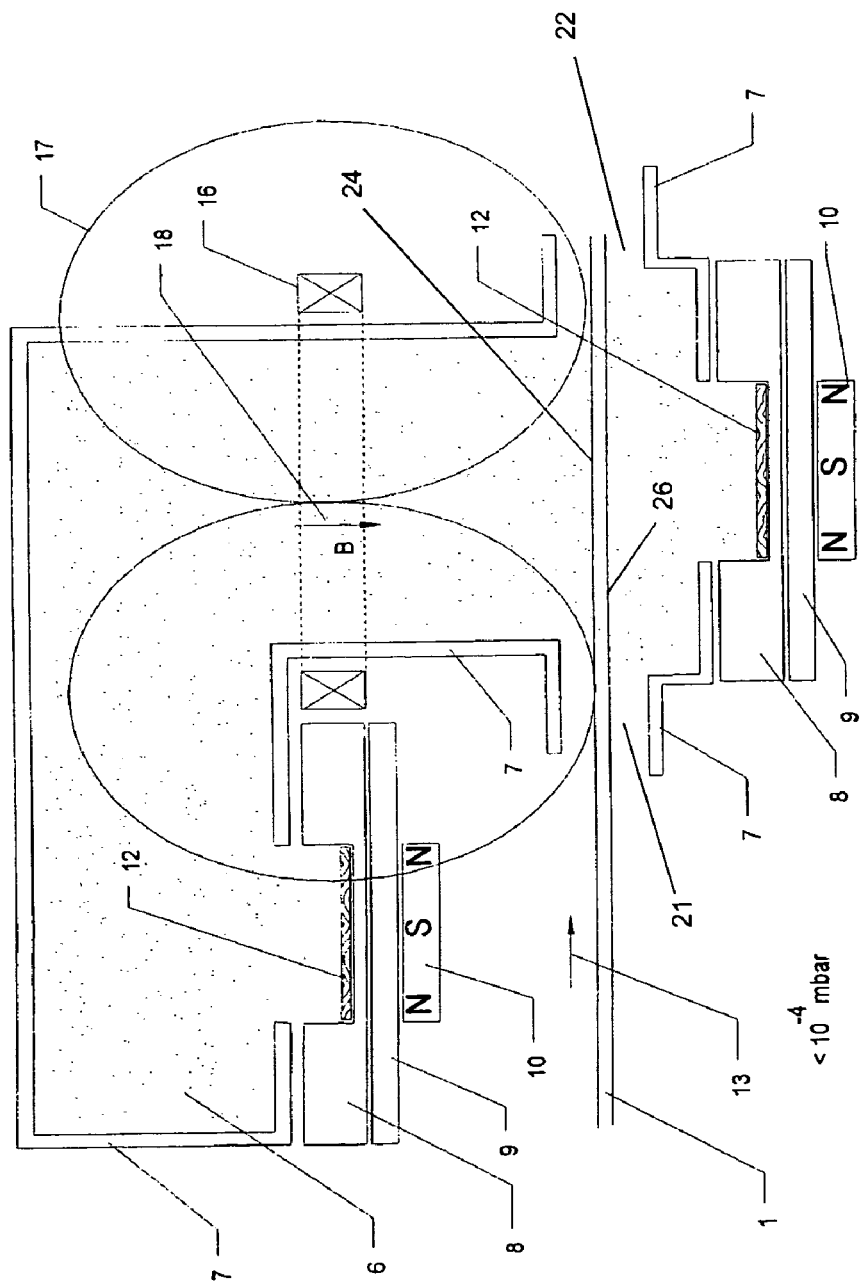
FIG. 6 is a schematic diagram in section, showing a fifth embodiment of the device proposed by the invention.

The device illustrated in FIG. 6 enables two faces of a substrate 1, in the form of a strip or a series of wires or alternatively beams passing through the confinement enclosure 7, to be coated simultaneously. This device is similar to that illustrated in FIG. 4 apart from the fact that a second holding tank 8' is provided underneath the substrate 1, as in FIG. 1. The coating to be applied to the top face 24 of the substrate 1 requires the presence of an induction field 17 produced by a solenoid 16. The bottom face 26 of the substrate 1 is coated from the liquid metal contained in the bottom holding tank 8'. The substrate fed into the confinement enclosure 7 through an inlet opening 21 and out from an outlet opening 22 acts as an anode. The walls of the confinement enclosure 7 are kept at a floating potential, specifically to avoid the formation of electric arcs, as described above.

The two holding tanks 8 and 8' are continuously supplied with liquid metal via tubes 5 and 5', not illustrated in the drawing, which are mechanically independent of the holding tanks 8 and 8', so that the level can be regulated by weighing the holding tanks 8 and 8'. The walls of the confinement enclosure 7 as well as the tanks 8 and 8' are at a sufficiently high temperature to avoid being contaminated by the metal vapour generated in inside the enclosure 7. Losses of metal vapour are limited by using seals in the form of slits on a level with the inlet and outlet openings for the substrate or substrates but also in the free spaces disposed between the upper surfaces of the holding tanks 8 and 8' and the walls of the confinement enclosure 7 adjacent to them.

In another configuration, the two holding tanks 8 and 8' may be connected to an alternating current generator to reduce the likelihood of arcing. In this case, however, it will be necessary for the generator to be electrically isolated from both the confinement enclosure 7 and the substrate 1.

Figure 7:
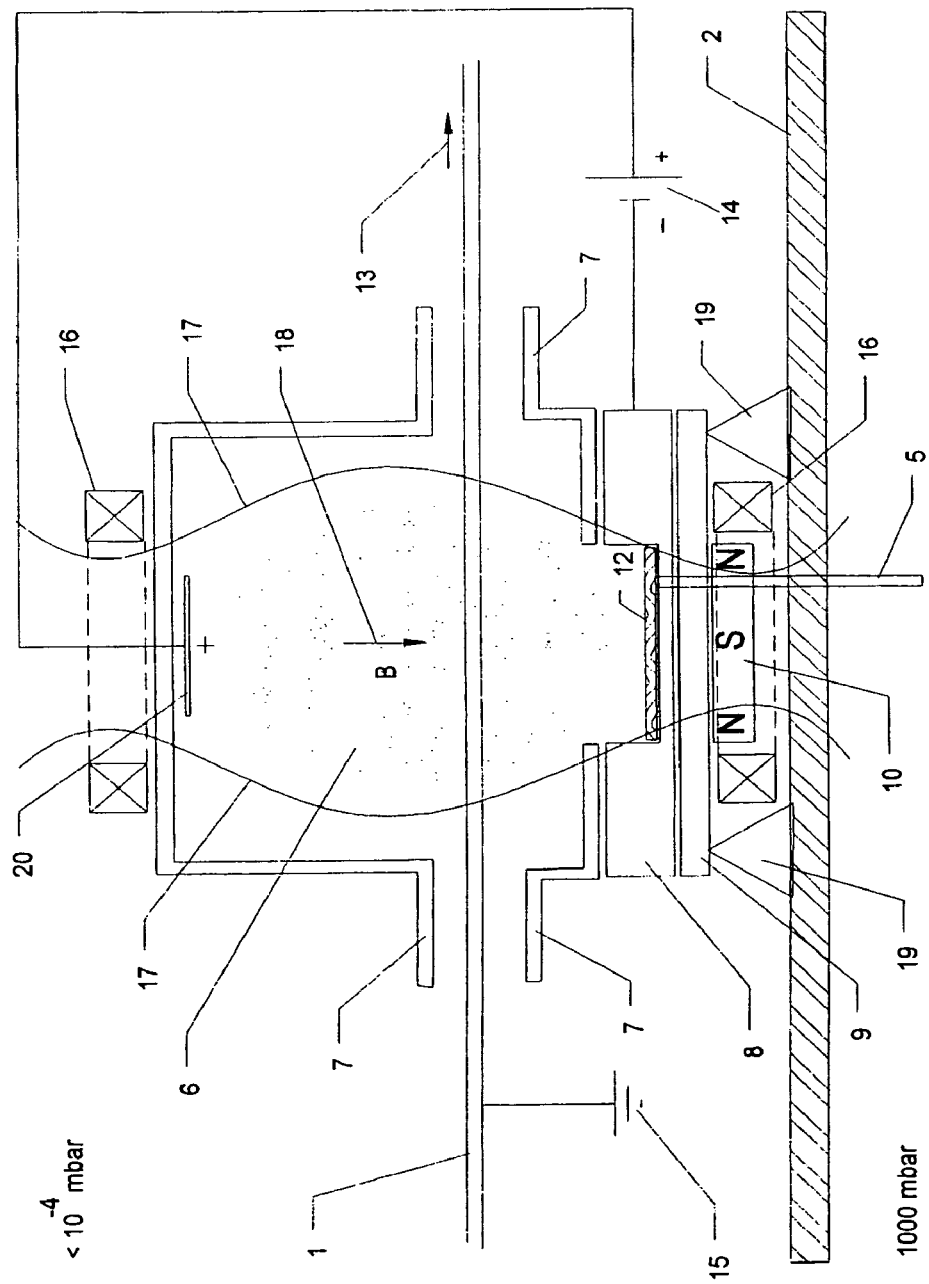
FIG. 7 is a schematic diagram in section, showing a sixth embodiment of a device proposed by the invention.

The specific embodiment of the device proposed by the invention illustrated in FIG. 7 enables a uniform coating to be applied to all the faces of the substrates 1 passed through the device using a single holding tank 8 located underneath these substrates. To this end, the holding tank 8 is at least twice as long in the direction in which the substrates are fed than the total width of the area projected by these substrates onto the surface 12 of the liquid metal. The distance between the top surface of the confinement enclosure 7, in front of which an anode 20 is disposed, and the top face of the substrate 1 must be sufficient for the pressure of the metal vapour there to remain substantially constant. A distance of a few centimetres, for example 5 to 10 cm, will satisfy this condition. In effect, at such distances, the consistency of the gas becomes viscous, which significantly increases the conductance of the section in question. To enable the electric discharge to be generated and hence the presence of a plasma throughout the entire confinement enclosure 7, two solenoids 16 are positioned behind the holding tank, on the one hand, and behind the anode on the other hand, to create a magnetic induction filed 17 as illustrated in FIG. 7. This magnetic induction field is mainly oriented in the direction of arrow 18 and extends between the anode 20 and the surface 12 of the liquid metal, enabling electrons to be carried from the surface 12 of the liquid metal, acting as a cathode, to the anode 20. Accordingly, plasma is diffused throughout the entire confinement enclosure 7, which produces a compact metal coating adhering to all the surfaces of the product.

A generator 14, not illustrated, operating with continuous or pulsed current, is provided, or alternatively a simply rectified current. Plasma will not be formed in front of the surface 12 of liquid metal except when its polarisation with respect to the anode 20 is negative. The holding tank 8 and the liquid metal on a level with the reservoir 4 (not illustrated) are connected to the negative pole of the generator 14. The reservoir 4, not illustrated, is, of course, electrically isolated from the potential of the substrates 1, the potential of the walls of the vacuum chamber 2 and the potential of the walls of the confinement enclosure 7 which are kept at a floating potential.

In another specific configuration (not illustrated), the top part of the confinement enclosure 7 may simply be provided in the form of a hot anode, i.e. at a temperature that will prevent the evaporated metal from being deposited on the anode. The sealing and electrical insulation for the side walls of the enclosure 7 is provided by means of slits in a manner similar to the seal between the walls of the enclosure 7 and the holding tank 8 as described above. The advantage of the device illustrated in FIG. 7 is its high technological simplicity.

Figure 8:
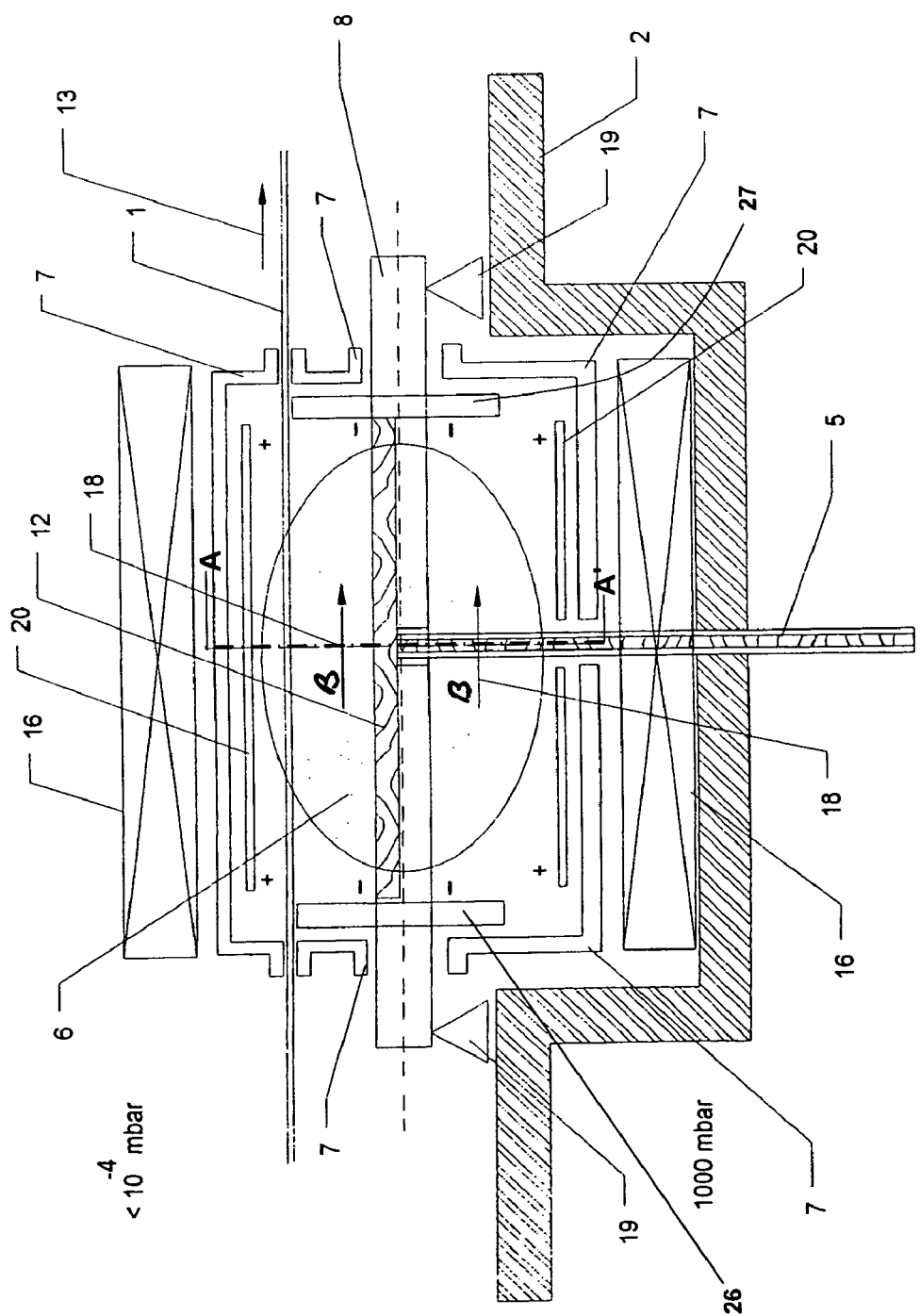
FIG. 8 is a schematic diagram in section, showing a seventh embodiment of a device proposed by the invention.

FIG. 8 illustrates a specific electrical and magnetic configuration enabling a magnetron discharge to be generated in a metal vapour leaving a holding tank 8, the metal vapour extending all around this holding tank 8. In this case, the holding tank 8, made from an electrically conductive material, passes through the confinement enclosure 7 in the direction in which the substrate 1 is displaced. The holding tank 8 is passed through the side walls of the confinement enclosure 7, which are at a floating potential, without coming into contact with them, by leaving a relatively small space of a few millimetres between the tank 8 and the walls to limit losses of metal through this space and to enable the holding tank to be displaced relative to the confinement enclosure 7. Accordingly, the holding tank 8 is supported and weighed outside of the confinement enclosure 7 by supports 19. This approach prevents the weighing system from being contaminated by metal vapour. The supports 19 are fitted with sensors, not illustrated in the drawing, enabling the weight of the liquid metal contained in the holding tank 8 to be weighed.

The holding tank 8 acts as the cathode of the system either with respect to hot anodes 20, or with respect to the substrate 1 to be coated if the latter is electrically conductive.

In yet another configuration, not illustrated, two holding tanks may be disposed in the same confinement enclosure 7 so that they can be polarised relative to one another by means of a supply operating with an alternating current, typically at a frequency of between 1 kHz and 1 MHz and preferably between 10 kHz and 100 kHz. Whenever a holding tank 8 is negatively polarised, the entirety of the surface 12 of liquid metal is bombarded with ions and activated species, contributing to the evaporation of the metal, whilst the other tank fulfils the role of anode. The process is reversed at the operating frequency of the supply.

The advantage of this configuration is that it avoids arcing in the discharge, especially if injecting a reactive gas such as $O_2$, $N_2$ and hydrocarbons, for example.

The holding tank 8 is supplied with liquid metal by means of a tube 5 that is not in contact with the latter, as described above, and is in turn supplied from a reservoir 4 of liquid metal, not illustrated in FIG. 8.

To enable the magnetron discharge to be generated around the tank 8, it is necessary to generate a magnetic induction field (B) 18 substantially parallel with the surface of the holding tank 8. This magnetic induction field 18 may be produced either by means of one or more solenoids 16, or by means of permanent magnets, surrounding the confinement enclosure 7.

The presence of the magnetic induction field B perpendicular to the electric field which exists in the cathodic sheath of the electric discharge helps to shift the electrons in a direction corresponding to that of the vectorial product of the magnetic field vector 18 and the electric field vector in the cathodic sheath and thus promotes diffusion of the plasma around the holding tank 8.

The presence of two bulges 26 and 27 may be seen at the end of the holding tank 8. These electrically conductive bulges 26 and 27 are at the potential of the cathode, i.e. the potential of the holding tank 8, and have the effect of electrostatically reflecting the electrons towards the centre of the electric discharge. Instead of using these electrostatic reflectors, it would also be conceivable to use magnetic mirrors. If the holding tank is long enough 8, these electron reflectors are no longer indispensable.

Figure 9:
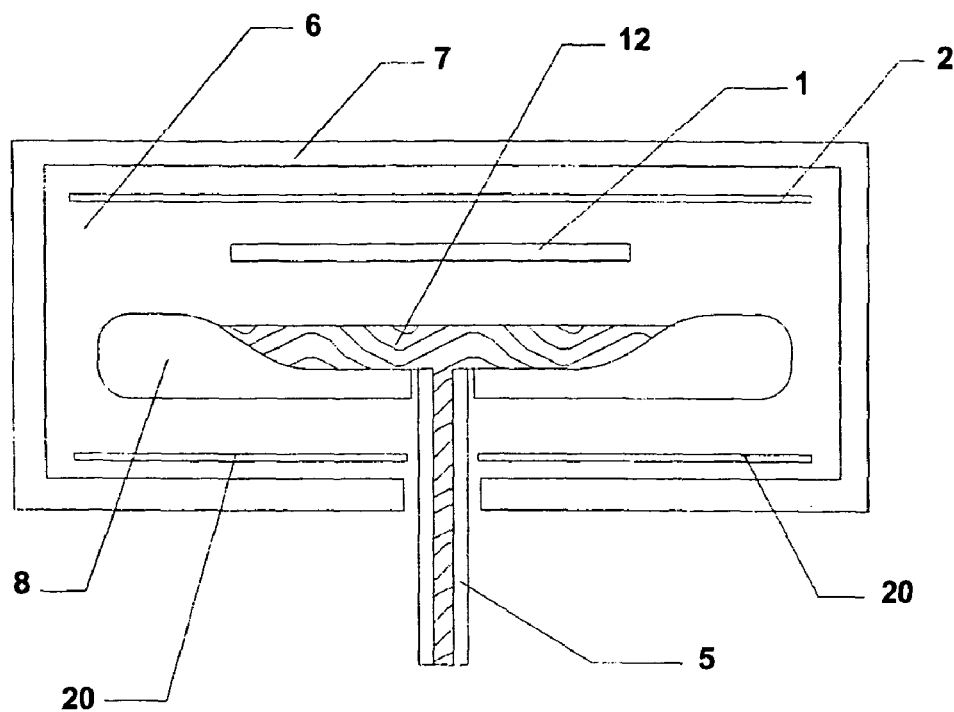
FIG. 9 is a cross-section along line A–A' indicated in FIG. 8.

FIG. 9 illustrates a cross-section along line A–A' indicated in FIG. 8. The holding tank 8 is located between two anodes 20 disposed close to the surfaces of the confinement enclosure 7. The substrate 1, which is a sheet, is displaced between the surface 12 of the liquid metal contained in the holding tank 8 and the top anode 20. The electric discharge and the metal vapour are formed all around the holding tank 8 and the substrate 1. The holding tank and the surface of the liquid metal is wider than the maximum width of the sheet to be treated.

Figure 10:
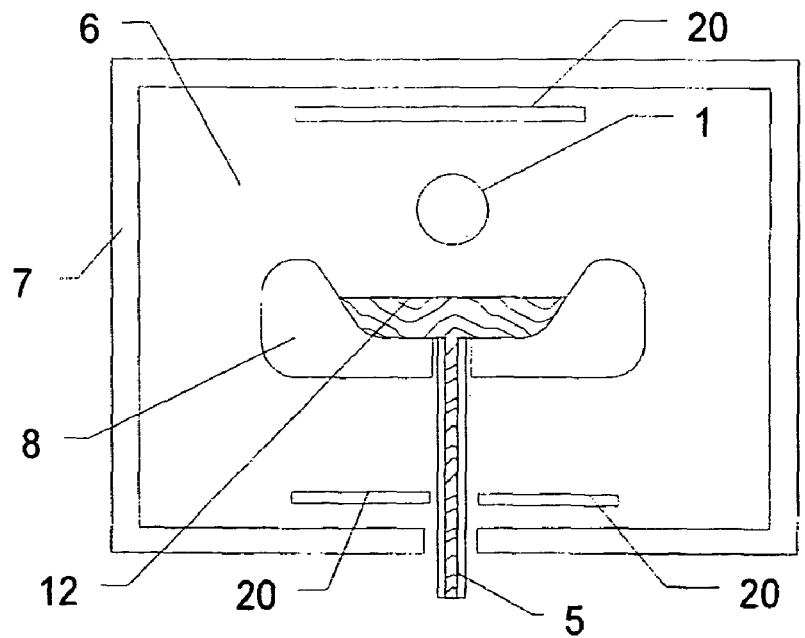
FIG. 10 is a section similar to that shown in FIG. 9 in the case of a device which has been adapted to coat a substrate in the form of a wire.

FIG. 10 shows a cross-section similar to that illustrated in FIG. 9 in the case of a device specifically adapted for coating substrates in the form of wires. The holding tank 8 in FIG. 10 is relatively narrow and extends underneath a substrate 1 in the form of a wire or fibre. The anodes 20 are maintained at a high enough temperature to prevent atoms of metal vapour from being deposited on these anodes.

In one variant, a single hot anode 20 is provided, which surrounds the holding tank 8 so that only the walls disposed transversely to the direction of displacement of the substrate 1 are maintained at a floating potential. A slit is provided between these walls in order to electrically isolate the walls from the anode and limit losses of metal vapour.

The method implemented by the device illustrated in FIG. 8 is particularly well suited to applying a metal coating to wires and fibres because all the vapour and plasma remains confined in the confinement enclosure around a holding tank 8 which can be very narrow in order to reduce consumption of the energy needed for deposition purposes.

Furthermore, by using hot anodes 20, it is possible to coat electrical insulating substrates such as optical fibres, for example.

In one particularly practical configuration, the hot anode completely surrounds the holding tank. This being the case, it is merely necessary to provide sealing and electrical insulation without any contact between the anode and the side walls of the confinement enclosure by providing narrow slits in the vicinity of the zones where the anode is adjacent to the side walls of the enclosure 7. The side walls of the enclosure 7, always kept at a floating potential, thus limit the formation of electric acs with the anode. The slits, which ensure a molecular flow of the gas, reduce losses of metal vapour towards the vacuum chamber 2. The different walls are made from a material with a low coefficient of bonding for the metal vapour and are hot enough to avoid being contaminated by it. Sealing and electrical insulation between the ends of the holding tank 8 and the side walls of the confinement enclosure 7, at the points where they are crossed, are provided in the same manner, in other words also by narrow slits.

EXAMPLES OF PRACTICAL APPLICATIONS

1. Continuous Zinc Coating Applied to a Hot-rolled Steel Sheet by Cold Plasma

In order to coat a hot-rolled steel sheet 1 m wide and 1 mm in thickness at a line speed of 100 m/min, the latter is continuously fed through a vacuum chamber containing, in addition to the device proposed by the invention, cascaded passages at the inlet and outlet as well as a cleaning section operated by etching before the zinc-coating section, and a passivation section where chrome is deposited by cathodic pulverisation (<<sputtering>>) located after the cold plasma zincking zone before the sheet leaves via the outlet passage.

The two faces of the steel sheet are coated simultaneously by means of eight deposition units of the type illustrated in FIG. 6. The intention is to apply a coating of zinc on two faces, 7.5 µm thick for each face. These units are capable of coating sheets up to 1 m in width for products up to a maximum of 1 cm in thickness. Treating less wide formats is not a problem other than the fact that the energy consumption per deposition unit is lower. The eight deposition units are arranged in pairs in four vacuum chambers, each connected to a molecular pumping unit, enabling a residual pressure of less than $10^{-2}$ Pa to be obtained in the vacuum chambers externally to the confinement enclosures 7 during operation.

Each deposition device proposed by the invention is supplied with metal vapour from two graphite holding tanks 8 for the liquid zinc 12. Each holding tank is connected to the negative pole of a continuous current generator 14. The positive pole is connected to the sheet and thus the ground of the system. The sheet is the anode of the system in this configuration. The tanks are rectangular in shape and their dimensions are 150 mm×1000 mm. The long side of the tank is oriented perpendicular to the direction in which the sheet is displaced.

Each holding tank is supplied with zinc via an aluminium tube. The tube could also be made from ceramic or from steel with an internal ceramic lining. The tube 5 extends through the holding tank as illustrated in FIG. 2. The tube 5 is aligned with the base of the tank 8 and a clearance of 1 mm can be seen between its external diameter and the diameter of the hole pierced through the tank. The level of zinc 12 in the tank may reach more than 4 cm without causing any leakage through the opening left free by this clearance. The tube runs through the tank on the side of the latter in such a way that it does not hinder the passage of the sheet, given that one of the tanks is disposed above the sheet. Supports 19, not illustrated in FIG. 6, are protected from the heat of the holding tank 8 by heat insulation 9. Disposed underneath the latter is a system of permanent magnets 10, enabling a magnetron discharge.

The supports 19 are fitted with sensors which continuously measure the weight of each holding tank 8. This weight measurement is used to operate a precise control of the level of liquid metal 12 in the tank. The signal transmitted by these sensors enables the level of the liquid metal in the tanks to be automatically and continuously regulated by varying the pressure of gas injected into the reservoirs 4 in the form of ovens, which supply the metal and keep it molten. The height of the zinc in each of the holding tanks 8 is regulated at 1 cm from the base of the tank. The two ovens, operating in conjunction with a common confinement enclosure, are electrically isolated from one another but also from the rest of the installation. The liquid zinc of each oven 4 is also placed in direct electrical contact with the negative terminal of the generator 14 of the holding tank which it supplies.

Each aluminium tube 5 runs through the wall of the vacuum chamber 2 via a sealed passage, not illustrated, and is sufficiently long to enable any differences in pressure between the exterior and interior of the vacuum chamber to be compensated, typically between 87 780 Pa and 105 070 Pa, due to the height of the liquid zinc in the tube between the top level of the bath in the oven 4 and the surface of the liquid zinc 12 in its holding tank 8. To this end, the length of the tube 5 is 2.3 m.

Sealing in the deposition device for the zinc vapour and for the plasma is provided by means of the confinement enclosure 7, as illustrated in FIG. 6. The inlet 21 and outlet slits 22 have a cross-section of 20 mm×1000 mm transversely to the direction of displacement of the strip and a length of 100 mm. Losses due to these slits are less than 1 kg of Zn per week in production mode. Heavier losses are observed on a level with hot joints provided in the form of slits of 3 mm over a length of 100 mm and disposed close to the top surfaces of the holding tanks 8 flush with the level of the external surfaces of the walls of the confinement enclosure 7. These losses of material are less than 10 kg per 24 h, during production time for each deposition unit of the type illustrated in FIG. 6.

Any zinc lost from the confinement enclosure is recovered in the vacuum chamber in solid form due to condensation on cold plates, not illustrated, specifically provided for this purpose. This zinc is eventually recycled back to the oven 4.

The walls of the confinement enclosure 7 are electrically isolated from the sheet, the holding tank and the vacuum chamber. They are at a floating potential. These are double walls so as to form cavities, inside which a heating system based on the Joule effect can be protected. This heating system enables the internal faces of the walls of the confinement enclosure 7 to reach a temperature in the order of 450° C., which is enough to prevent contamination by the zinc. The current generator powering this heating system for the walls is electrically isolated from the rest of the installation in order to keep the walls of the confinement enclosure 7 at a floating potential.

The walls are designed so that they can expand and contract without detrimentally affecting sealing of the system. The external surfaces of the confinement enclosure 7 are made from polished stainless steel (<<inox>>) with a low emissivity (0.25), whilst the internal surfaces are made from stainless steel oxidised at high temperature with a higher emissivity (0.85), in order to absorb the radiation generated by the heating system and preferably heat the internal surfaces of the confinement enclosure 7. The advantage of this configuration is that it minimises the energy consumption needed to heat the confinement enclosure 7.

To ensure that the discharge operates correctly on a level with the top target, i.e. on a level with the holding tank disposed above the sheet, as illustrated in FIG. 6, a solenoid 16 is placed around the confinement enclosure 7 to produce an induction field, the intensity of which is greater than 0.005 T (50 Gauss). This field firstly enables electrons from the top target to be returned towards the sheet acting as an anode and secondly ensures that the plasma is diffused by preference along the lines of the magnetic induction field rather than perpendicular to them.

When the deposition device proposed by the invention is in operating mode and a 1 m wide sheet is fed through the device at a speed of 100 m/min, each of the sixteen continuous current generators for the eight deposition devices consumes a power of 30 kW at a difference in potential of 950 V. Each of the sixteen ovens, all being electrically isolated from one another and from ground, is fitted with a 4 kW heating capacity. Each system for heating the walls of the confinement enclosures consumes 10 kW, i.e. a total power consumption of 80 kW for the eight deposition units.

The total power needed to apply a coating of Zn 7.5 μm thick on both sides of the sheet at a line speed of 100 m/min at 1 m wide is therefore 624 kW.

2. Continuously Applying a Metal Coating to an Optical Fibre by Cold Plasma

An optical fibre is continuously treated in the device proposed by the invention by cold plasma, under vacuum, at a speed of 1000 m/min. The inlet and outlet of the device are fitted with cascaded passages. Prior to the metal-coating treatment by cold plasma, the surface of the fibre is cleaned by passing it through a plasma or argon and oxygen before being sensitised by a deposit of chromium a few nanometres in thickness, applied by cathodic sputtering. The metal coating produced in the next step of the process by a device as proposed by the invention is passivated by a 10 nm layer of chromium, again by cathodic sputtering, before the fibre leaves the vacuum chamber via the outlet passage.

The metal coating step consists in applying a 5 μm layer of Zn, i.e. a 5 μm coating of Sn on the surface of the fibre. The metal coating is applied in a device of the type illustrated in FIG. 8, but with a slight modification as far as the confinement enclosure is concerned.

The confinement enclosure essentially consists of a cylindrical anode with an internal diameter of 150 mm, made from graphite and surrounding a holding tank 8, also made from graphite, with a semi-cylindrical cross-section and a diameter of 40 mm. Lateral sealing is provided by means of two walls of the confinement enclosure at a floating potential, made from graphite. Metal vapour losses are limited by providing narrow slits between the side walls and respectively the anode and the holding tank 8 for the metal.

The length of the holding tank used for the purposes of deposition inside the confinement enclosure is 1 m. The anode may be heated, as are the side walls at floating potential, by Joule effect. The respective potentials of the different walls are not altered by the heating system. Any losses from the confinement enclosure are limited by one or more cylinders of polished stainless steel (<<inox>>) with an emissivity of 0.25, at a floating potential, surrounding the anode. The entire length of the fibre is fed through the device bit by bit. The holding tank passes through the side walls so that it can be supported by the supports 19 fitted with the weighing device.

A clearance of less than 1 mm is left between the tube 5 for supplying the liquid metal and the holding tank 8. The supply tube is made from aluminium.

In this device, a magnetron discharge is produced in the metal vapour around the holding tank, which acts as the cathode of the system due to the presence of a magnetic induction field 18 of 0.05 T (or 500 Gauss) produced by means of a solenoid 16 surrounding the entire length of the deposition device. The top edges 26 and 27 located at the two ends of the holding tank enable electrons to be returned towards the centre of the discharge by electrostatic reflection.

Continuous Zincking of Optical Fibres by Cold Plasma:

To produce a 5 μm deposit of Zn on an optical fibre with a diameter of 100 μm at a line speed of 1000 m/min, eight deposition devices with a 1 m effective length are needed, of the type illustrated in FIG. 8. Each of the eight holding tanks 8 for the liquid zinc is supplied from its own reservoir 4 in the form of an oven, which is electrically isolated both from the other ovens and from the ground of the system.

Zinc consumption is 673 g/h per fibre. In the case of a fibre, the power needed for deposition purposes is mainly used to compensate for energy losses, given the low consumption of zinc. The power supplied to each deposition system is 1.2 kW for actual deposition purposes and 2 kW for heating the anode by Joule effect. This results in a total consumption of 26 kW to obtain the required coating.

Continuous Tin-plating of an Optical Fibre by Cold Plasma

To produce a 5 µm coating of Sn on an optical fibre with a diameter of 100 µm at a line speed of 1000 m/min, it is necessary to provide 25 deposition systems of the type described above. Metal consumption is in the order of 700 g/h and the power needed for deposition purposes is 2 kW per deposition system. For a single shield of stainless steel surrounding the hot anode, which is at a temperature of 1300° C., the radiation loss reaches 41 kW per deposition system. Four concentric cylinders enable this loss to be reduced to approximately 1 kW. The minimum total power needed to produce the required coating is therefore 75 kW.

3. Continuous Zinc Coating of a Low Carbon Steel Wire by Cold Plasma

A coating of zinc is applied to a low carbon steel wire by cold plasma using the same type of deposition system as that used to apply a zinc coating to an optical fibre, i.e. that illustrated in FIG. 8. It merely needs to be adapted in terms of the inlet and outlet to limit losses of zinc vapour and enable a 5 mm diameter wire to be passed through. Losses at the inlet and outlet are limited by passing the wire through hollow cylinders 50 mm in length and 10 mm in internal diameter, respectively fixed to the inlet and outlet side walls of the confinement enclosure for the metal vapour.

Two deposition devices of 1 m in effective length will be sufficient to produce a 5 µm coating of Zn on the wire at a line speed of 300 m/min with an average consumption of 4 kW for deposition purposes, per deposition system.

The anode must also be heated by Joule effect to compensate for a radiation loss in the order of 4 kW per deposition system. The total power needed to apply a coating of zinc is therefore 16 kW, i.e. 8 kW per deposition system, for a zinc consumption of 10 kg per hour, i.e. a consumption of 5 kg/h per deposition system.

As explained in the description, the present invention generates a plasma in a relatively well sealed enclosure for the metal vapour, with hot walls and for which the junctions of antagonistic potential surfaces, in particular the anode and the cathode, are provided in the form of hot walls at a floating potential. The electrical isolation is obtained by leaving a free space in the form of as narrow as possible a slit between the surfaces to be isolated. The use of electrical isolation inside the confinement enclosure would rapidly lead to short circuits due to contamination by deposits of metal vapour. Different configurations are proposed which enable the top face of a substrate to be coated with metal. By preference, a magnetic field is used to ensure that the electrons are returned towards the anode.

The invention also provides a supply system for liquid metal, consisting of a tube with no mechanical connection to the holding tank for this metal. Consequently, it is possible to control and regulate the level of the metal in the holding tank, constituting the target, simply by weighing the latter.

Naturally, the invention is not restricted to the different embodiments of the method and device described here and illustrated in the appended drawings, and other embodiments could be envisaged, in particular as regards the structure and shape of the confinement enclosure 7, the position and shape of the anodes and solenoids or the permanent magnets, without departing from the scope of the invention.

Likewise, other regulating means could be provided as a means of modifying the level of the liquid metal in the sealed reservoir 4, for example by introducing more liquid metal. Under certain circumstances, it might be possible to use a counter-electrode in the form of a separate electrically conductive element, even if the substrate itself is electrically conductive. In other situations, both the electrically conductive substrate and the separate element could simultaneously form the counter-electrode.

The section of the inlet and outlet opening of the confinement enclosure is adapted to suit the cross-section of the substrates to be coated. Accordingly, in the case of substrates with a circular cross-section, the inlet and outlet opening will be in the form of a cylindrical tube, the internal diameter of which will be slightly bigger, for example by 2 to 5 mm, than the diameter of the substrate.

The invention claimed is:

1. Method of depositing a metal coating on a substrate (1), whereby the deposit is applied by cold plasma inside a confinement enclosure (7) heated to prevent a deposit of metal from forming on its surface, this enclosure (7) having an inlet opening (21) and an outlet opening (22) through which the substrate (1) to be coated enters and leaves the latter, a metal vapour source constituting an electrode being provided in this enclosure (7) enabling the plasma to be formed (6) therein, a counter-electrode being formed by the substrate (1) or by a separate electrically conductive element, characterised in that the metal needed to produce the coating of metal on the substrate (1) is introduced in the liquid state into a holding tank (8) communicating with the confinement enclosure (7) and the liquid metal in this tank (8) is kept at a substantially constant level during the process of forming this metal coating by weighing the holding tank (8), the liquid metal being introduced into this tank by means of a tube that is mechanically independent of the holding tank (8), wherein the holding tank (8) is supplied from a reservoir of liquid metal (4) external to said enclosure (7) by regulating the difference in pressure prevailing between the interior of the enclosure (7) and a gas present in the reservoir (4).

2. Method as claimed in claim 1, characterised in that the liquid metal in the holding tank (8) is heated substantially uniformly by plasma, optionally by generating a magnetron discharge in the proximity of this tank (8), and optionally at least partially around it.

3. Method as claimed in claim 1, characterised in that the level of the metal in the holding tank (8), is periodically or substantially continuously measured, and the tank (8) is supplied with liquid metal depending on the measured level measured therein.

4. Method as claimed in claim 2, characterised in that the level of the metal in the holding tank (8), is measured on an essentially continuous basis, and the tank (8) is supplied with liquid metal depending on the measured level measured therein.

5. Method as claimed in claim 1, characterised in that the holding tank (8) is weighed in order to determine the level of the liquid metal and the holding tank (8) is supplied with liquid metal depending on the measured weight.

6. Method as claimed in claim 2, characterised in that the holding tank (8) is weighed in order to determine the level of the liquid metal and the holding tank (8) is supplied with liquid metal depending on the measured weight.

7. Method as claimed in claim 1, characterised in that at least the part of the confinement enclosure (7) adjacent to the metal vapour source is maintained at a floating potential.

8. Method as claimed in claim 2, characterised in that at least the part of the confinement enclosure (7) adjacent to the metal vapour source is maintained at a floating potential.

9. Method as claimed in claim 1, characterised in that if the substrate (1) to be coated is not electrically conductive, a separate electrode (20) is used, which is installed in the confinement enclosure (7) and heated to a high enough temperature to prevent it from being contaminated by the metal vapour.

10. Method as claimed claim 2, characterised in that if the substrate (1) to be coated is not electrically conductive, a separate electrode (20) is used, which is installed in the confinement enclosure (7) and heated to a high enough temperature to prevent if from being contaminated by the metal vapour.

11. Method as claimed in claim 1, characterised in that if the substrate (1) to be coated is electrically conductive, it is maintained at a positive potential with respect to the metal vapour source, which thus acts as an anode, whilst the vapour source acts as a cathode.

12. Method as claimed claim 2, characterised in that if the substrate (1) to be coated is electrically conductive, it is maintained at a positive potential with respect to the metal vapour source, which thus acts as an anode, whilst the vapour source acts as a cathode.

13. Method as claimed in claim 1, characterised in that an alternating potential is applied to the electrode and to the counter-electrode.

14. Method as claimed claim 2, characterised in that an alternating potential is applied to the electrode and to the counter-electrode.

15. Method as claimed in claim 1, characterised in that if the substrate (1) is in the form of a strip, of which only one face is to be coated with a metal layer, the face of the substrate (1) which does not have to be coated is displaced at a distance of at least one centimeter from the internal walls of the confinement enclosure (7).

16. Method as claimed claim 2, characterised in that if the substrate (1) is in the form of a strip, of which only one face is to be coated with a metal layer, the face of the substrate (1) which does not have to be coated is displaced at a distance of at least one centimeter from the internal walls of the confinement enclosure (7).

17. Method as claimed in claim 1, characterised in that the walls of the confinement enclosure (7) are heated by Joule effect.

18. Method as claimed in claim 2, characterised in that the walls of the confinement enclosure (7) are heated by Joule effect.

19. Device for depositing a metal layer on a substrate (1), comprising
(a) a confinement enclosure (7) with an inlet opening (21) and an outlet opening (22) through which the substrate (1) to be coated with the metal layer can enter and leave this enclosure (7),
(b) means for heating the walls of this enclosure (7),
(c) at least one holding tank (8) for a liquid metal communicating with this enclosure (7) and constituting an electrode,
(d) a counter-electrode formed by the substrate (1) or by a separate electrically conductive element (20) and
(e) means for generating a plasma (6) in this enclosure (7) at least above the liquid metal,
whereby (f) means are provided for keeping the liquid metal at a substantially constant level, these means comprising a regulating device enabling the level of the liquid metal in the holding tank (8) to be controlled by weighing, and
whereby (g) a supply tube (5) for the liquid metal is provided opening into the holding tank (8), this tube (5) being mechanically independent of the holding tank (8), whereby (h) it has a reservoir (4), communicating with the holding tank (8), containing the liquid metal, the level of which is lower than the level of liquid metal in the holding tank (8), means being provided to supply the holding tank (8) with liquid metal from said reservoir (4) on a substantially constant basis.

20. Device as claimed in claim 19, characterised in that a space is left free between the enclosure (7) and the holding tank (8).

21. Device as claimed in claim 20, characterised in that said free space is formed by a slit of a width of between 0.5 and 5 mm.

22. Device as claimed in claim 19, characterised in that the holding tank (8) co-operates with means enabling the quantity of liquid metal contained in the holding tank (8) to be measured.

23. Device as claimed in claim 20, characterised in that the holding tank (8) co-operates with means enabling the quantity of liquid metal contained in the holding tank (8) to be measured.

24. Device as claimed in claim 19, characterised in that regulating means are provided to enable the height of the level of liquid metal in the reservoir (4) and/or of the latter itself to be varied depending on the level of liquid metal in the holding tank (8) in order to keep the latter substantially constant.

25. Device as claimed in claim 19, characterised in that said reservoir (4) is contained in an oven.

26. Device as claimed in claim 19, characterised in that it has magnetic confinement means for the plasma.

27. Device as claimed in claim 26, characterised in that the confinement means comprise a solenoid (16) which is so disposed relative to the confinement enclosure (7) that a magnetic induction field (18) is created extending between the surface of the substrate (1) to be coated and the holding tank (8).

28. Device as claimed in claim 26, characterised in that the confinement means comprise a solenoid (16) which surrounds the confinement enclosure (7) so as to create a magnetic induction field (18) all around the holding tank (8) passing through this enclosure (7).

29. Device as claimed in claim 19, characterised in that means are provided for heating the walls of the confinement enclosure (7) by Joule effect to a temperature high enough to prevent the metal from condensing on these walls.

30. Device as claimed in claim 20, characterised in that means are provided for heating the walls of the confinement enclosure (7) by Joule effect to a temperature high enough to prevent the metal from condensing on these walls.

31. Device as claimed in claim 19, characterised in that the inlet opening (21) and the outlet opening (22) of the confinement enclosure (7) are formed by heated tubes, the cross-section of which substantially matches the shape of the section of the substrate (1) and is of a dimension slightly larger than that of the substrate (1) to be coated, the length of these tubes in the direction of displacement of the substrate (1) being at least twice the dimension of the free space measured between the external surface of the substrate (1) and the internal surfaces of the inlet and outlet openings (21,22).

32. Device as claimed in claim 20, characterised in that the inlet opening (21) and the outlet opening (22) of the confinement enclosure (7) are formed by heated tubes, the cross-section of which substantially matches the shape of the section of the substrate (1) and is of a dimension slightly larger than that of the substrate (1) to be coated, the length of these tubes in the direction of displacement of the substrate (1) being at least twice the dimension of the free space measured between the external surface of the substrate (1) and the internal surfaces of the inlet and outlet opening (21,22).

33. Device as claimed in claim 19, characterised in that it has two separate holding tanks (8) electrically isolated from one another, means being provided in order to apply to these tanks (8) alternately a positive and negative potential with respect to one another.

34. Device as claimed in claim 20, characterised in that it has two separate holding tanks (8) electrically isolated from one another, means being provided in order to apply to these tanks (8) alternately a positive and negative potential with respect to one another.

35. Device as claimed in claim 19, characterised in that means are provided to enable the substrate (1) to pass through the metal vapour created in the confinement enclosure (7) so that all the external faces of the substrate (1) can be covered.

36. Device as claimed in claim 20, characterised in that means are provided to enable the substrate (1) to pass through the metal vapour created in the confinement enclosure (7) so that all the external faces of the substrate (1) can be covered.

37. Device as claimed in claim 21, wherein said free space is formed by a slit of a width in the order of 2 to 3 mm.

38. Method of depositing a metal coating on a substrate (1), whereby the deposit is applied by cold plasma inside a confinement enclosure (7) heated to prevent a deposit of metal from forming on its surface, this enclosure (7) having an inlet opening (21) and an outlet opening (22) through which the substrate (1) to be coated enters and leaves the latter, a metal vapour source constituting an electrode being provided in this enclosure (7) enabling the plasma to be formed (6) therein, a counter-electrode being formed by the substrate (1) or by a separate electrically conductive element, characterised in that the metal needed to produce the coating of metal on the substrate (1) is introduced in the liquid state into a holding tank (8) communicating with the confinement enclosure (7) and the liquid metal in this tank (8) is kept at a substantially constant level during the process of forming this metal coating by weighing the holding tank (8), the liquid metal being introduced into this tank by means of a tube that is mechanically independent of the holding tank (8), wherein the holding tank (8) is supplied from a reservoir of liquid metal (4), in which the level of the metal is lower than the level of the liquid metal in the holding tank (8), by regulating the height of the reservoir (4) depending on the level of the metal in the holding tank (8).

39. Device for depositing a metal layer on a substrate (1), comprising (a) a confinement enclosure (7) with an inlet opening (21) and an outlet opening (22) through which the substrate (1) to be coated with the metal layer can enter and leave this enclosure (7), (b) means for heating the walls of this enclosure (7), (c) at least one holding tank (8) for a liquid metal communicating with this enclosure (7) and constituting an electrode, (d) a counter-electrode formed by the substrate (1) or by a separate electrically conductive element (20) and (e) means for generating a plasma (6) in this enclosure (7) at least above the liquid metal, whereby (f) means are provided for keeping the liquid metal at a substantially constant level, these means comprising a regulating device enabling the level of the liquid metal in the holding tank (8) to be controlled by weighing, and whereby (g) a supply tube (5) for the liquid metal is provided opening into the holding tank (8), this tube (5) being mechanically independent of the holding tank (8), wherein (h) the supply tube (5) for the liquid metal extends through a wall of the holding tank (8), a clearance being provided between the wall and the tube (5) of a dimension such that the metal is not able to flow through this clearance due to the surface tension of the metal yet allows the holding tank (8) and the tube (5) to move freely relative to one another.

40. Device as claimed in claim 39, whereby the supply tube (5) for the liquid metal extends through the bottom wall of the holding tank (8).

* * * * *